United States Patent [19]
Ida et al.

[11] Patent Number: 5,700,627
[45] Date of Patent: Dec. 23, 1997

[54] DEVICE FOR THE INSOLATION OF MICROMETRIC AND/OR SUBMICROMETRIC AREAS IN A PHOTOSENSITIVE LAYER AND A METHOD FOR THE CREATION OF PATTERNS IN SUCH A LAYER

[75] Inventors: Michel Ida, Voreppe; Robert Baptist, Jarrie, both of France

[73] Assignee: Commissariat a l'Energie Atomique, Paris, France

[21] Appl. No.: 696,716

[22] Filed: Aug. 14, 1996

[30] Foreign Application Priority Data

Aug. 17, 1995 [FR] France ................... 95 09878

[51] Int. Cl.⁶ .................................. G03C 5/00
[52] U.S. Cl. ............ 430/311; 430/327; 430/331; 313/309
[58] Field of Search .................. 430/327, 311, 430/331; 313/309

[56] References Cited

U.S. PATENT DOCUMENTS 4,857,161  8/1989  Borel et al. ............. 204/192.26

FOREIGN PATENT DOCUMENTS

| 2 593 953 | 8/1987 | France . |
| 2 663 462 | 12/1991 | France . |
| 2 687 839 | 8/1993 | France . |
| 2253925 | 9/1992 | United Kingdom . |

OTHER PUBLICATIONS

Patent Abstracts of Japan, No. JP 57181549, vol. 7, No. 030 (P-173), Feb. 5, 1983.
Patent Abstracts of Japan, No. JP 58004148, vol. 7, No. 075 (P-187), Mar. 29, 1983.
La pulvérisation par ultra-sons appliquée a la spectrometrie d'absorption atomique, by J. Spitz and G. Uny, Applied Optics, vol. 7, No. 7, Jul. 1968.
Chemical Vapor Deposition at Low Temperatures, by J. C. Viguie and J. Spitz, vol. 122, No. 4, Apr. 1975, pp. 585–588.
Chemical Abstract 1997: 175,368 no month available.
Chemical Abstract 1996: 302,465 no month available.

*Primary Examiner*—Kathryn L. Gorgos
*Assistant Examiner*—Kishor Mayekar
*Attorney, Agent, or Firm*—Pearne, Gordon, McCoy & Granger LLP

[57] ABSTRACT

A device for insolating micrometric areas in a photosensitive layer and a method for producing patterns in such a layer.

The method is characterized in that the layer is subjected to an atmosphere containing a transparent liquid that does not wet the photosensitive material, in order to produce on this layer a monolayer of micro-droplets (121), the layer of photosensitive material is insolated through the monolayer of micro-droplets (121) in order to selectively print the areas of exposure (122) of the layer, the micro-droplets (121) are removed, and the layer of photosensitive material is developed in order to form said patterns in accordance with the areas of exposure.

14 Claims, 3 Drawing Sheets

DEVICE FOR THE INSOLATION OF MICROMETRIC AND/OR SUBMICROMETRIC AREAS IN A PHOTOSENSITIVE LAYER AND A METHOD FOR THE CREATION OF PATTERNS IN SUCH A LAYER

TECHNOLOGICAL FIELD

This invention relates to a method for the formation of patterns, such as holes, for example, in a layer of photosensitive material.

It is notably applicable to the manufacture of micro-point cathode electron sources which are used in particular for the production of imaging devices operating by cathodoluminescence excited by field emission.

The invention permits, for example, the manufacture flat micro-point screens of a large size, for example greater than 14 inches (about 35 cm), and even flat micro-point screens having a surface area close to 1 m².

It is of course understood that screens of a size significantly greater can be developed thanks to this invention.

STATE OF PRIOR ART

Micro-point cathode electron sources and their manufacturing methods are described, for example in documents (1), (2), (3) and (4) given as references at the end of this description to which reference can be made.

To facilitate the understanding of the technical problem which has been solved by this invention, a known example of a method of manufacturing a micropoint cathode electron source is described below.

Reference will be made to FIGS. 1 to 3 of the appended drawings.

FIG. 1 shows a structure already developed which includes a substrate 2 with an insulator 4 mounted thereon, a system of cathode conductors 6, a resistive layer 7 and superimposed intersecting grids 8, with an intermediate insulator 10, and a layer 12, for example of nickel, deposited on the surface, used as a mask during the micro-point production operations.

This layer 12 of nickel, the grids 8 and the insulator 10 have holes 14, at the bottom of which micro-points will be subsequently deposited comprising a metal conductor electrically linked to the cathode conductors 6 through the resistive layer 7.

The production of the micro-points will now be explained making reference to FIG. 2.

First one begins by carrying out, for example, the deposition of a layer of molybdenum 16 on the entire structure.

This layer 16 has a thickness of about 1.8 μm.

It is deposited at an angle of incidence normal to the surface of the structure.

This deposition technique allows obtaining cones 18 of molybdenum housed in the holes 14 and having a height of 1.2 to 1.5 μm.

These cones comprise the electron emitting micropoints.

Selective dissolution of the nickel layer 12 is then carried out by an electrochemical method, in such a way that the perforated grids 8, made for example of niobium, are separated as may be seen in FIG. 3, and the electron emitting micro-points 18 are made apparent.

With a few technological variations, the known method which has been described, with reference to FIGS. 1, 2 and 3, is one of those which have been applied up to the present time to produce the micropoints of micro-point cathode electron sources.

In order for the size and the positioning of the micropoints 18 to be correct, it is of course necessary to control perfectly the size of the holes made in the grids 8 and in the insulator 10.

The problem is therefore the following:

Holes with a mean diameter of, for example, 1.3 μm or less, are to be made in all the surfaces which are to receive micro-points.

The methods used at present to produce these holes involve photolithographic methods using direct projection or the photorepetition of an elementary pattern reproduced on all these surfaces.

In the case of large size electron sources, greater than 14 inches (about 35 cm) for example, these methods rapidly become very restricting.

Direct projection requires the production of a large size mask 1 incorporating submicron patterns. These patterns are generally made of metal deposited in a thin layer on a silica or a glass substrate.

This mask is difficult to make when it has a diagonal greater than 14 inches, with the traditional techniques used in micro-electronics.

With regard to photorepetition, a small size mask is used, the size being determined by the resolution of the patterns used.

For a resolution of 1 μm, a mask with a side of 20 to 50 mm is used, which requires the insolation operation necessary for the photolithography, to be repeated a large number of times in order to cover the total surface of the electron source.

Both of these methods (the one using direct projection and the other photo-repetition) are therefore difficult to apply to the production of electron sources of large size.

This invention allows the production of a mask for the formation of holes corresponding to the electron sources, in a much simpler way than the known methods mentioned above.

Its also relates to a very simple method for the formation of holes and other patterns in a layer of photosensitive material.

The invention allows the formation of holes with a diameter that can be of the order of 1 μm or less than 1 μm, on small surfaces or on large surfaces.

The invention allows the insolation of a layer of photosensitive resin at those points of the layer that correspond to the sites of holes to be formed in the resin.

This resin, once developed (i.e. after dissolution of the insolated areas), can be used as a mask in order to form patterns, such as for example, holes corresponding to micro-point electron sources, in a structure on which the layer of resin is situated.

For example, with respect to the structure described with reference to FIGS. 1 to 3, the layer of resin can be used, after development, to etch the grids 8 and the intermediate insulator 10.

More precisely, an aim of this invention is a method for the formation of a monolayer of micro-beads on the surface of the resin, these micro-beads permitting the production of holes in this photosensitive resin.

Another aim of this invention is to provide a method for the production of micrometric patterns, in relief, in a layer of photosensitive material.

It is also an aim to provide a method which is simple to implement and which allows substrates having a photosensitive layer of large surface area to be treated.

DISCLOSURE OF THE INVENTION

In order to achieve these aims, the object of the invention is, more precisely, a method for producing micrometric and/or sub-micrometric patterns in a layer of photosensitive material situated on a substrate. In accordance with the method, the layer is subjected to an atmosphere containing a liquid that does not wet the photosensitive material in a manner that produces a monolayer of micro-droplets of the non-wetting liquid on this layer, the layer of photosensitive material being kept at a temperature sufficiently low to prevent the coalescence of the micro-droplets with one another; the layer of photosensitive material is insolated through the monolayer of micro-droplets in order to selectively print the areas of exposure of the photosensitive layer with an insolation light; the micro-droplets are removed, and the layer of photosensitive material is developed in order to form said patterns in accordance with the areas of exposure. The non-wetting liquid used is a liquid transparent to the insolation light and each micro-droplet focuses the insolation light in one of said areas of exposure.

The micro-droplets formed on the surface of the layer of photosensitive material are also referred to by the term "micro-beads". The non-wetting property of the liquid with respect to the photosensitive layer allows obtaining micro-beads that are approximately spherical.

By an atmosphere containing a liquid which does not wet the photosensitive material is meant either an atmosphere containing said liquid in the form of a vapour or an atmosphere in the form of a "mist" comprising, in suspension, droplets of the liquid. By way of example, in the case where the photosensitive material is a resin and where the non-wetting liquid is water, the atmosphere to which the layer is subjected contains water vapour or droplets produced by an aerosol atomiser.

Hence, the atmosphere can be formed either by a vapour generator or by an atomiser of the pneumatic or ultra-sonic type, for example. Preferably, an atomiser capable of supplying graded droplets can be used.

The patterns that are created in the layer of photosensitive material can correspond to the areas of exposure, i.e. the areas reached by the insolation light but they may equally well correspond to the complementary areas of the photosensitive layer, i.e. the areas which are not exposed to the insolation light. This is dependent on the choice of photosensitive material.

When the photosensitive material is a positive resin, the development removes areas of exposure which have been insolated. On the other hand, when it is a negative resin, development removes the photosensitive material outside the areas of exposure, retaining the material in the areas exposed.

The design of the patterns that one wishes to produce is determined by the micro-droplets, or micro-beads, formed on the photosensitive material. Since the non-wetting liquid used is transparent to the wavelength or wavelengths of the insolation light, each micro-bead forms a lens which focuses the light onto the areas referred to as the areas of exposure. These areas correspond approximately to the areas of contact of the micro-droplets with the surface of the photosensitive material.

The expression "area of exposure" is understood as an area of focus where the photosensitive layer is subjected to an intense insolation light in contrast with the areas which are either not reached by the light or are reached by the direct insolation light, that is to say light which has not been concentrated by a micro-bead. This contrast between strongly insolated areas of exposure and the other areas allows, at the time of development of the photosensitive layer, the formation of the desired patterns.

Preferably, one may insolate the layer of photosensitive material with an insolation light sufficiently intense to print the photosensitive material in the areas of exposure in which the micro-droplets focus the light, and sufficiently weak to not print the photosensitive material outside the areas of exposure.

An important application of the invention is the production of holes in a layer of positive photosensitive resin being used as a mask for the manufacture of an electron source.

Hence the invention also relates to a method of manufacture of a micro-point cathode electron source according to which:

a structure including cathode conductors is formed on a substrate, an electrically insulating layer is formed on the cathode conductors, and, grids are formed on this electrically insulating layer which make an angle with the cathode conductors, holes are formed through the grids and the insulating layer in areas where the grids cross the cathode conductors, micro-points of electron emitting material are formed in these holes, on the cathode conductors, this method being characterised in that these holes are obtained by forming a layer of positive photosensitive resin at least in said areas, at the surface of the structure, by forming openings in the layer of resin in accordance with the method described above and by etching the grids and the insulating layer through these openings formed in the resin layer.

The invention also relates to a flat display screen using the electron source obtained by this method.

The invention finally relates to a device for the implementation of the method, that is to say for the insolation of micrometric areas of a layer of photosensitive material arranged on a substrate. This device comprises a generator of an atmosphere containing a liquid which does not wet the photosensitive material, a source of insolation light, and a support system for the substrate including the layer of photosensitive material, capable of controlling the temperature of this substrate and of holding it successively opposite said generator and opposite the light source.

According to one particular aspect, the support system can comprise a substrate carrier capable of cooling the substrate and means of fixing the substrate onto the substrate carrier in order to expose the layer of photosensitive material.

Other characteristics and advantages of this invention will become more clearly apparent from the following description, given for illustrative purposes only, being non-limitative, with reference to the appended Figures.

DETAILED DESCRIPTION OF EMBODIMENTS THE INVENTION

Figure 1:
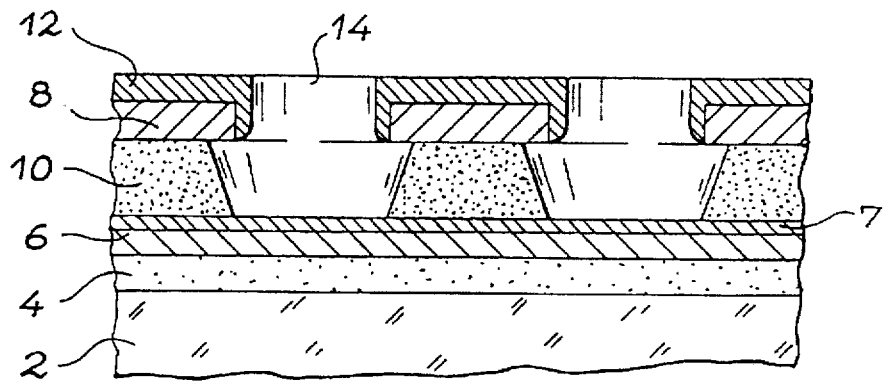
FIGS. 1 to 3, already described, are diagrammatic partial sections illustrating a known method of manufacturing a micro-point cathode electron source.
Figure 2:
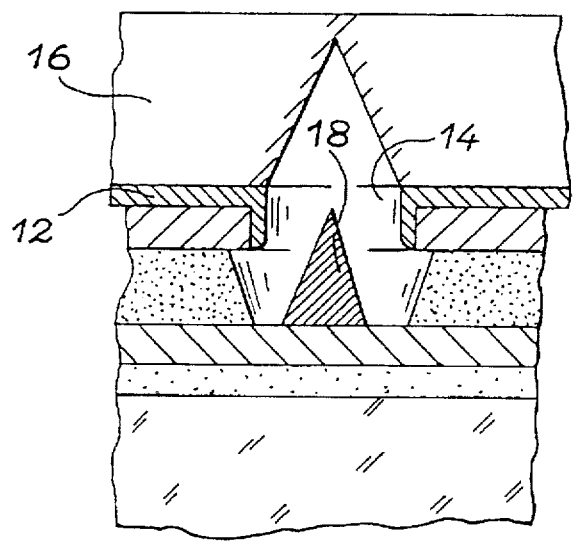
Figure 3:
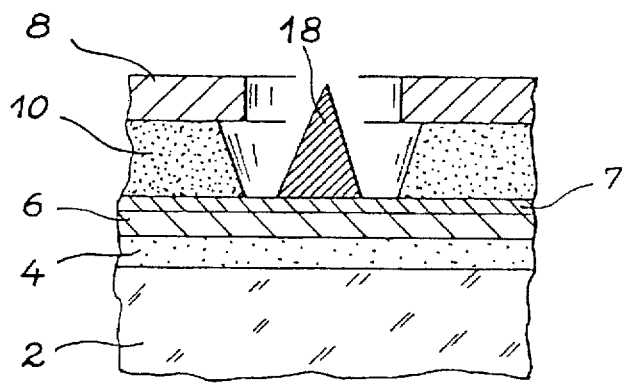
Figure 4:
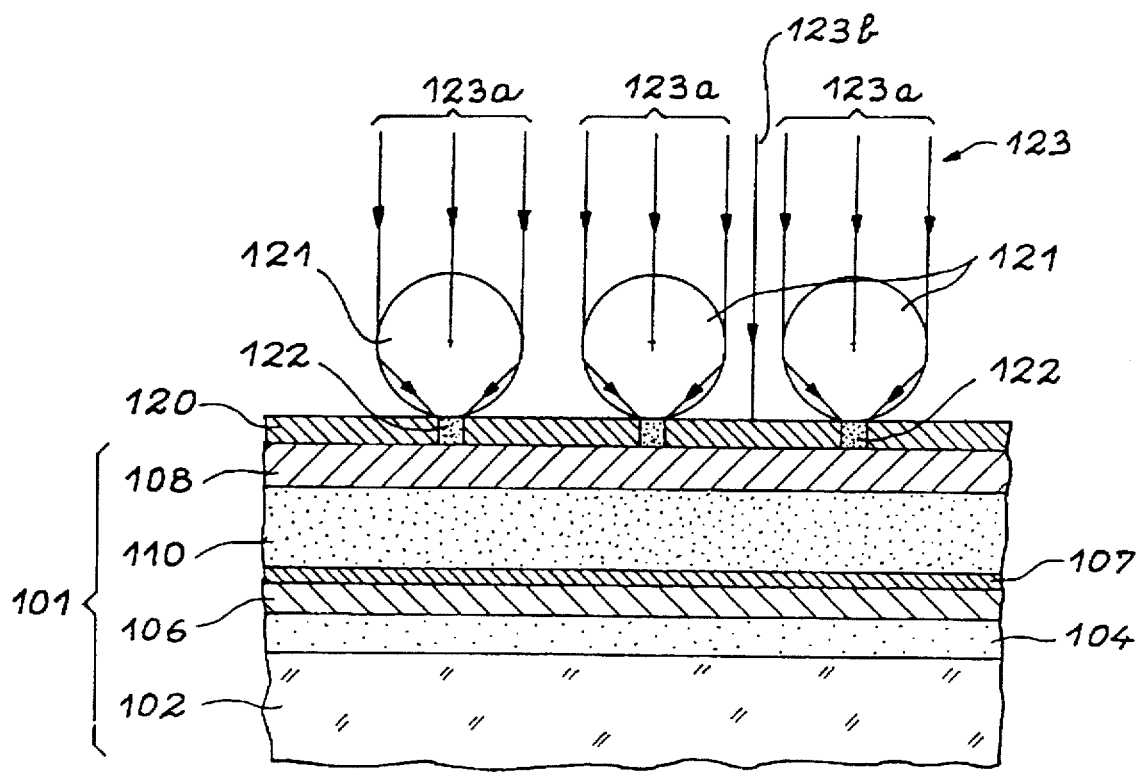
FIG. 4 is a diagrammatic section of an electron source substrate and shows the insolation of areas of exposure of a surface layer of resin in accordance with the invention.

FIG. 4 shows in a diagrammatic way the focusing function of the micro-droplets deposited on the surface of a layer of photosensitive material in selectively insolating certain parts of the layer. The example in FIG. 4 relates to the formation of holes in a layer of positive photosensitive resin. The layer of resin (120) is then itself used as a mask for the formation of holes in the underlying layers (108,110) for the production of a structure in accordance with that already described in FIG. 1. In FIG. 4, for simplification reasons, identical reference numbers with 100 added to them have been used for components identical or similar to the components in FIG. 1.

Hence, the stack 101 illustrated in FIG. 4 comprises a substrate 102 overlaid, in that order, by an electrically insulating layer 104, a system of cathodic electrical conductors 106, a resistive layer 107, an electrically insulating intermediate layer 110 and grids 108 superimposed in criss-cross form.

On the surface of the stack 101, i.e. above the grids 108, one wishes to form an etching mask with openings corresponding to the holes that one wants to make in layers 108 and 110. These holes correspond to the holes 14 in FIG. 1.

Hence, a layer 120 of photosensitive material, in this case, a positive photosensitive resin, is formed on the stack 101. Openings are made in this resin layer in accordance with this invention.

By subjecting the resin layer 120 to an atmosphere charged with water vapour or to an atmosphere incorporating an aerosol mist, and by cooling the layer 120, micro-droplets 121 are formed on its surface. The cooling of the layer 120 has a double role of condensing the droplets and preventing the coalescence of them. By way of example, for a resin layer on which micro-droplets of water are formed, it is advisable to cool the layer 120 to a temperature, preferably between −5° and +5° C.

When the micro-droplets 121 have been formed, the photosensitive layer 120 is exposed to parallel insolation light represented by reference number 123.

In the example in FIG. 4, the micro-droplets of water 121 are transparent to the wavelengths of the insolation light. The micro-droplets 121, or micro-beads, focus and hence concentrate the rays of light 123a which hit them into areas 122, referred to as areas of exposure, in which the photosensitive layer 120 is printed.

The intensity of the insolation light or the exposure time is chosen so that the rays of light 123b which hit the layer 120 directly, do not print it.

After the removal of the micro-droplets 121, the layer 120 is developed in order to form the patterns in accordance with the areas of exposure. In the case of this example, development allows the removal (dissolution) of the layer material in the areas 122 in a way that creates openings therein. The layer 120 finally forms a mask for the etching of cavities in layers 108 and 110 in accordance with known methods.

The patterns that are produced are not necessarily holes but can also be micro-reliefs.

By way of example, if the layer of positive resin is replaced by a layer of negative resin, in the context of the example of FIG. 4, micro-cylinders would be obtained in relief instead of holes. The photosensitive material is then removed in all the regions which did not have micro-droplets at the time of insolation.

Figure 5:
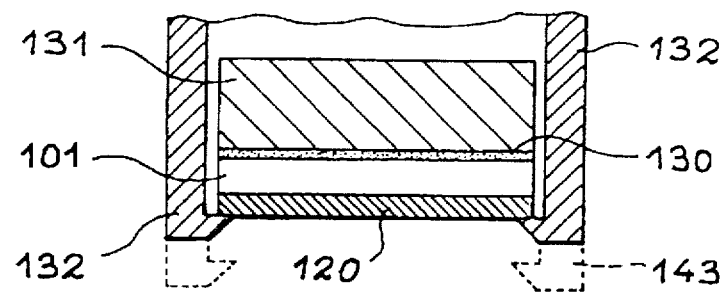
FIG. 5 is a diagrammatic representation of a substrate support system for the treatment of a layer of photosensitive material in accordance with the invention.
Figure 6:
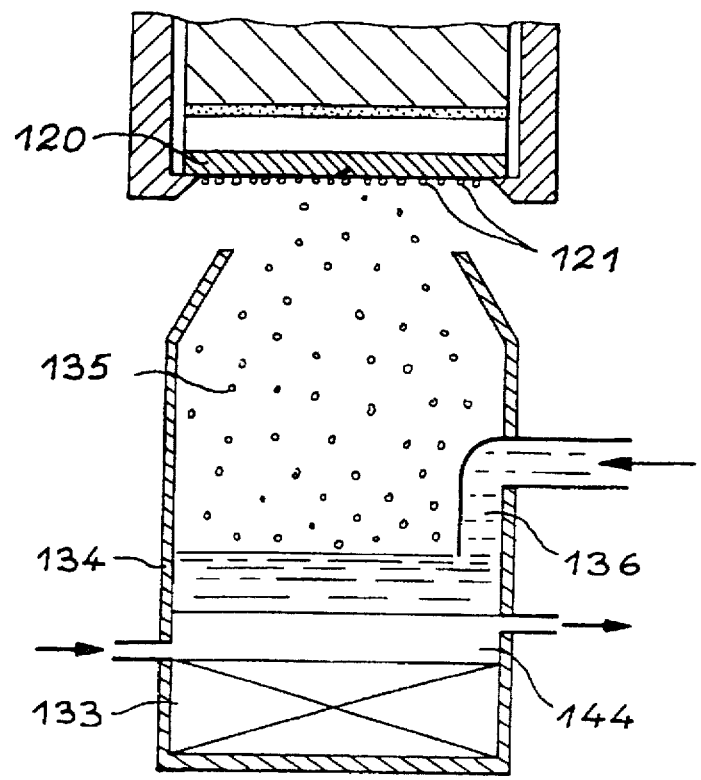
FIG. 6 shows in a diagrammatic way an ultrasonic atomiser and illustrates the formation of a monolayer of micro-droplets on the layer of photosensitive material, in accordance with the invention.
Figure 7:
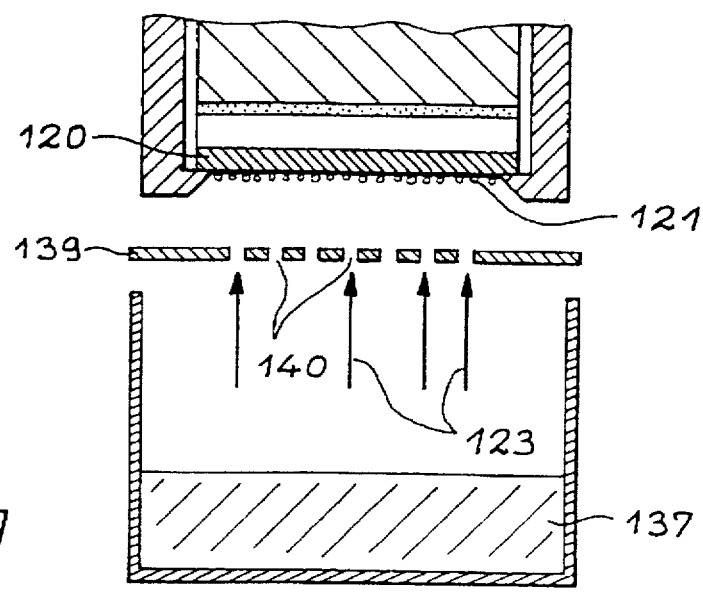
FIG. 7 shows in a diagrammatic way a step of insolation of the layer of photosensitive material through the monolayer of micro-droplets by means of a light source.

FIGS. 5 to 7 show more precisely a device intended for the implementation, notably, of operations for the formation of micro-beads and for insolation, in accordance with the invention.

As is shown in FIG. 5, the assembly formed by the stack 101 and a photosensitive layer 120 is held by a support system. This support system comprises a substrate carrier 131 onto which the stack 101 is fixed, via its face represented by the substrate 102, and covered by a layer of photosensitive resin 120 deposited on its other face represented by the metallic layer 108 by means of grips 132. The grips 132 can be moved from a position 143 represented by broken lines, in which the stack 101 and the layer 120 can be released or inserted into the support system, to a position represented by continuous lines in which the grips are used to hold the stack 101 covered by the layer 120.

A disc 130, for example made of an elastomer with good thermal conductivity, is advantageously positioned between the substrate carrier 131 and the substrate 102 of the stack 101 to facilitate thermal exchanges between these components and make them uniform.

In effect, the substrate carrier has the function of cooling the substrate 101, and consequently, the layer of resin 120, so as to bring it to a temperature suitable for the formation of the micro-droplets.

After the substrate is installed in the support system and after its cooling, the assembly is transferred above a mist generator. FIG. 6 diagrammatically shows such a generator. This is an ultra-sonic generator of the Pyrosol Spray type. However, it is possible to replace this generator with any type of generator of aerosol, mist, vapour or micro-droplets which allows the formation of micro-droplets on the surface of the resin layer 120.

The mist generator represented in FIG. 6 includes a container 134 containing the non-wetting liquid used for the formation of the micro-droplets. The level of the liquid in the container 134 is kept roughly constant by a liquid inlet 136.

An ultra-sound generator 135, placed under the container 134, is provided in order to transmit ultrasound to the liquid, so as to form graded micro-droplets 135, as a spray. The ultra-sonic coupling between the ultra-sound generator 133 and the container 134 is achieved through a transducer 144, cooled by water in order to stabilise the operating conditions.

In order to obtain micro-droplets with a desired size, that corresponds to a particular application, it is advisable to adjust the different parameters of the generator such as the power, the frequency, a gas flow in the generator, the flow rate of liquid and its temperature. In this way, micro-droplets with a size from 0.5 to 7 μm, for example, can be obtained. In the interests of simplification, the details and components of the generator such as an air or gas inlet, are not shown in the Figure.

By way of example, for a commercial apparatus, with an operating frequency of 1 MHz, droplets of a size of the order of 3 to 4 μm are obtained.

For the topic of atomisation by ultra-sound, it is possible to refer to documents (5) and (6) given as references at the end of this description.

As is also shown in FIG. 6, the substrate 101, provided with the photosensitive layer 120 is held advantageously above container 134 until a layer of micro-droplets forms on the surface of layer 120.

The relative positioning of the container and the substrate represented in FIG. 6 allows the layer 120 to be turned face downwards and the opening of the container 134 to be directed upwards. This arrangement is not essential but it prevents the deposition of undesirable large drops of liquid on the photosensitive layer.

FIG. 7 relates to the insolation step of the method of the invention. The substrate 101, provided with the layer 120 is moved to a source 137 of parallel light. The layer 120 is then subjected to the light 123 from the source through the monolayer of droplets 121. The choice of a non-wetting liquid, transparent to the wavelength of the light permits, as explained above, allows the selective printing of certain areas of the photosensitive layer 120.

A mask 139 can be positioned between the source of light 137 and the monolayer of micro-droplets 121. In this way, it is possible, selectively, to only insolate certain regions of the layer 120 that correspond to openings 140 in the mask 139. It is possible, for example, in the case of the example illustrated in FIG. 4, to retain regions in which holes are not formed.

The steps of the method shown in FIGS. 5 to 7 are carried out under an atmosphere of controlled humidity, temperature and dust level in order to avoid any parasitic effects on the method.

The transfer of the substrate by the support system to being in front of the mist generator and then in front of the light source can be carried out either by continuous passage past them or by stopping in front of these items of equipment.

Furthermore, after insolation, the assembly of substrate 101 covered by the layer 120 is transferred to an unloading station, not shown, where the micro-droplets are removed with a solvent or by evaporation. The photosensitive layer 120 is then developed, in order to dissolve, for example, the printed areas, and then to form the patterns such as holes or reliefs. Finally, thanks to the invention, it is possible to produce micrometric holes and reliefs, in a simple fashion, and on large surfaces.

The production of micro-holes can be used for the manufacture of micro-point screen, electron sources as mentioned above and also for the manufacture of devices such as networks of holes or micro-perforated membranes.

The production of micro-reliefs can be used, for example, in anti-glare systems or in the manufacture of micro-cylinder matrices.

DOCUMENTS MENTIONED IN THIS DESCRIPTION (1) FR-A-2 593 953 (see also EP-A-0 234 989)

(2) U.S. Pat. No. 857,161

(3) FR-A-2 663 462

(4) FR-A-2 687 839 (see also EP-A-0 558 393)

(5) "Pulvérisation par ultrasons appliquée à la spectrométrie d'absorption atomique" by J. SPITZ and G. UNY—Applied Optics, vol. 7, No. 7, JULY 1968.

(6) "Chemical vapour deposition at low temperatures" by J. C. VIGUIE and K. SPITZ—Journal of the Electrochemical Society, vol. 122, No. 4, APRIL 1975.

We claim:

1. A method of producing micrometric or submicrometric patterns in a layer of photosensitive material positioned on a substrate comprising the steps of:
   subjecting the layer to an atmosphere containing liquid that does not wet the photosensitive material in a manner that produces a monolayer of micro-droplets of the non-wetting liquid on this layer, the photosensitive material layer being kept at a temperature sufficiently low to prevent the coalescence of the micro-droplets with one another,
   insolating the layer of photosensitive material through the monolayer of micro-droplets to selectively print areas of exposure of the photosensitive layer with an insolation light,
   removing the micro-droplets,
   developing the layer of photosensitive material to form micrometric or submicrometric patterns in accordance with the areas of exposure,
   wherein the non-wetting liquid is transparent to the insolation light, each micro-droplet focusing the light in said areas of exposure.

2. A method according to claim 1, wherein the layer of photosensitive material is insolated with the insolation light sufficiently intense to print the photosensitive material in the areas of exposure in which the micro-droplets focus said light, and sufficiently weak to not print the photosensitive material outside the areas of exposure.

3. A method according to claim 1, wherein the layer of photosensitive material is a positive resin.

4. A method according to claim 3, wherein during development the photosensitive material is removed from the areas of exposure.

5. A method according to claim 1, wherein the layer of photosensitive material is a negative resin.

6. A method according to claim 1, wherein during the development of the photosensitive material, the photosensitive material is removed outside the areas of exposure while retaining the material in the areas of exposure.

7. A method according to claim 1, wherein the non-wetting liquid is water.

8. A method according to claim 1, wherein the atmosphere containing the non-wetting liquid is formed with an atomizer capable of forming graded micro-droplets.

9. A method according to claim 8, wherein an ultra-sonic atomizer is used.

10. A method according to claim 8, wherein an pneumatic atomizer is used.

11. A method according to claim 1, wherein the atmosphere containing the non-wetting liquid is formed with a generator of vapor from the liquid.

12. A method according to claim 1, wherein the layer of photosensitive material is insolated through a mask positioned between a source of insolation radiation and the monolayer of micro-droplets, this mask having openings corresponding to regions of the layer of photosensitive material to be insolated.

13. A method according to claim 1, wherein the patterns are openings going through the layer of photosensitive material.

14. A method of manufacturing a micro-point cathode electron source comprising the steps of:
   forming a structure including cathode conductors on a substrate, forming an electrically insulating layer on the cathodic conductors, and forming grids on the electrically insulating layer which make an angle with the cathodic conductors,
   forming holes through the grids and the insulating layer in areas where the grids cross the cathodic conductors,
   forming micro-points of electron emitting material in the holes, on the cathodic conductors,
   wherein the holes are obtained by forming a layer of positive photosensitive resin at least in said areas, at a surface of the structure, by forming openings in the layer of the resin in accordance with the method according to claim 1 and by etching the grids and the insulating layer through the openings formed in the resin layer.

* * * * *